United States Patent
Shimose et al.

(12)

(10) Patent No.: US 6,203,918 B1
(45) Date of Patent: Mar. 20, 2001

(54) LAMINATE FOR HDD SUSPENSION AND ITS MANUFACTURE

(75) Inventors: Makoto Shimose, Kimitsu; Hisashi Watanabe; Seigo Oka, both of Kisarazu; Yuji Matsushita, Kimitsu; Eri Kabemura, Chiba, all of (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/242,568

(22) PCT Filed: Aug. 18, 1997

(86) PCT No.: PCT/JP97/02850

§ 371 Date: Feb. 19, 1999

§ 102(e) Date: Feb. 19, 1999

(87) PCT Pub. No.: WO98/08216

PCT Pub. Date: Feb. 26, 1998

(30) Foreign Application Priority Data

Aug. 19, 1996 (JP) .................................................. 8-217349

(51) Int. Cl.$^7$ ..................................................... B32B 15/08
(52) U.S. Cl. ..................... 428/458; 156/320; 156/327; 156/330.9; 427/388.1; 428/473.5
(58) Field of Search ................... 156/320, 327, 156/330.9; 427/388.1; 428/458, 473.5

(56) References Cited

U.S. PATENT DOCUMENTS 5,262,227 * 11/1993 Takabayashi et al. ................ 428/215

FOREIGN PATENT DOCUMENTS

| 60-157286 | 8/1985 | (JP) . |
| 60-246015 | 12/1985 | (JP) . |
| 63-245988 | 10/1988 | (JP) . |
| 1-245586 | 9/1989 | (JP) . |
| 2-304712 | 12/1990 | (JP) . |
| 3-123093 | 5/1991 | (JP) . |
| 5-131604 | 5/1993 | (JP) . |

* cited by examiner

*Primary Examiner*—D. S. Nakarani
(74) *Attorney, Agent, or Firm*—Birch, Stewart, Kolasch & Birch, LLP.

(57) ABSTRACT

This invention relates to laminates for use in HDD suspensions which are composed of a stainless steel base material and successive layers formed thereon of polyimides and an electrical conductor and in which the linear expansion coefficient of the polyimide layer is controlled in the range of $1\times10^{-5}/°$ C. to $3\times10^{-5}/°$ C. and the adhesive strength between stainless steel and polyimide and that between polyimide and electrical conductor are controlled at 0.5 kg/cm or more. This invention also relates to a process for preparing laminates for use in HDD suspensions comprising applying a solution of polyimide precursors or polyimides to a stainless steel base material with a thickness of 10 to 70 $\mu$m in one layer or more, drying, performing heat treatment at 250° C. or more to form a layer of polyimides with a thickness of 3 to 20 $\mu$m and a linear expansion coefficient of $1\times10^{-5}/°$ C. to $3\times10^{-5}/°$ C. and contact-bonding said layer of polyimides under heat to a layer of electrical conductor with a thickness of 3 to 20 $\mu$m.

Laminates of this invention for use in HDD suspensions are practically free of deflection during etching and are suited for integrally-wired HDD suspensions.

14 Claims, No Drawings

LAMINATE FOR HDD SUSPENSION AND ITS MANUFACTURE

This application is the national phase under 35 U.S.C. §371 of prior PCT International Application No. PCT/JP97/02850 which has an International filing date of Aug. 18, 1997 which designated the United States of America.

FIELD OF TECHNOLOGY

This invention relates to laminates for use in HDD suspensions and also to a process for preparing the same.

BACKGROUND TECHNOLOGY

An HDD (hard disk drive) suspension has been prepared by etching stainless steel foil, and a magnetic head, such as a thin-film inductive head is mounted onto the tip of such suspension and wire bonded with gold wire. In recent years, however, concentrated studies are under way aiming at reduced size, higher density and higher capacity of HDD and, as the studies progress, reduction of flying height of a slider onto which a magnetic head is mounted has become a theme of the utmost importance. From this viewpoint, the conventional gold wires have presented an obstacle to reduction of flying height because of their resistance to air and rigidity. Moreover, wire bonding with such gold wires presents difficulties in automating the step for connecting gold wires with a magnetic head.

As a solution to the problems related to wire bonding with a gold wire, a process such as disclosed in Japan Kokai Tokkyo Koho Sho 60-246015 (1985) proposes to effect patterning with electrically insulating polyimide directly on a stainless steel foil and form a circuit with copper on the polyimide patterns in order to form signal lines directly on a suspension in place of the aforementioned gold wire. A suspension on which signal lines are formed directly in this manner or the so-called integrally-wired suspension does not cause problems of interference with reduction of flying height of a slider due to resistance to air and rigidity of signal lines and also makes it possible to automate the connecting process of a magnetic head.

On the other hand, Japan Kokai Tokkyo Koho Hei 5-131604 (1993) discloses a process for laminating polyimides to a thin metal sheet. However, no attention is paid to the thermal expansion of the polyimides in use and high values of the thermal expansion coefficient concretely disclosed there suggest that deflection tends to occur readily after removal of the metal by etching from the laminate. Moreover, lamination performed as disclosed tends to show variation in adhesive strength between the metal sheet and the polyimide layer and, in addition, gives problematical heat resistance, which makes application of this process difficult to HDD suspensions. Thus, development of materials free of the aforementioned problems was looked for.

Accordingly, an object of this invention is to provide laminates which produce minimal deflection during etching and are suitable for integrally-wired suspensions and to provide a process for preparing said laminates.

After intensive studies of the aforementioned theme, the present inventors have found that the formation of polyimide with specified linear expansion coefficient and adhesive strength on the base material gives laminates suitable for HDD suspensions and completed this invention.

DISCLOSURE OF THE INVENTION

This invention is related to laminates for use in HDD suspensions comprising a stainless steel base material and successive layers formed thereon of polyimides and an electrical conductor wherein the linear expansion coefficient of the layer of polyimides is in the range of $1 \times 10^{-5}/°$ C. to $3 \times 10^{-5}/°$ C. and the adhesive strength between the stainless steel base material and the layer of polyimides and that between the layers of polyimides and the electrical conductor are 0.5 kg/cm or more respectively.

This invention is also related to a process for preparing laminates for use in HDD suspensions comprising applying a solution of polyimide precursors or polyimides in one layer or more to a stainless steel base material with a thickness of 10 to 70 $\mu$m, drying, performing heat treatment at 250° C. or higher to form a layer of polyimides with a thickness of 3 to 20 $\mu$m and a linear expansion coefficient of $1 \times 10^{-5}/°$ C. to $3 \times 10^{-5}/°$ C., and contact-bonding said layer of polyimides under heat to a layer of an electrical conductor with a thickness of 3 to 20 $\mu$m.

Furthermore, this invention is related to a process for preparing laminates for use in HDD suspensions comprising applying successively a solution of polyimides with high thermal expansion 1 or a solution of polyimide precursors with high thermal expansion 1, a solution of polyimide precursors with low thermal expansion, and a solution of polyimides with high thermal expansion 2 or a solution of polyimide precursors with high thermal expansion 2 to a stainless steel base material with a thickness of 10 to 70 $\mu$m, drying, performing heat treatment at 250° C. or higher to form a layer of polyimides with a thickness of 3 to 20 $\mu$m and a linear expansion coefficient of $1 \times 10^{-5}/°$ C. to $3 \times 10^{-5}/°$ C., and contact-bonding said layer of polyimides under heat to a layer of an electrical conductor with a thickness of 3 to 20 $\mu$m.

There is no specific restriction to a stainless steel base material to be used in the laminates for HDD suspensions of this invention. However, it is preferably SUS 304 or more preferably SUS 304 tension-annealed at 300° C. or higher from the viewpoint of spring characteristics and dimensional stability required for suspensions. The thickness of the stainless steel base material is preferably 10 to 70$\mu$, more preferably 15 to 51 $\mu$m. As a base material for HDD suspensions, the thickness is preferably in the range from 18 to 30 $\mu$m from the viewpoint of reduction in size and weight and rigidity of HDD suspensions. A stainless steel base material with a thickness of less than 10 $\mu$m tends to cause large deflection of the laminate and leads to a loss in reliability when used in suspension. On the other hand, a base material with a thickness in excess of 70 $\mu$m shows excessively large rigidity and a slider onto which the base material is mounted is not amenable to reduction of flying height.

A stainless steel base material to be used in this invention preferably has a linear expansion coefficient in the range of $1.75 \times 10^{-5}/°$ C. to $2.0 \times 10^{-5}/°$ C. in each of the transverse and longitudinal directions with the difference between the two directions kept at $0.15 \times 10^{-5}/°$ C. or less, it preferably shrinks 0.025% or less in both directions when heated at 330° C. for 30 minutes in air, and the average roughness (R a) along center line on the surface to be laminated to the layer of polyimides is preferably 20 to 300 nm. When the linear expansion coefficient or the shrinkage after heat treatment exceeds the aforementioned range or value, the laminates tend to produce large deflection. On the other hand, when the average roughness (R a) along center line is less than 20 nm, it becomes difficult to obtain sufficient adhesion between the stainless steel base material and polyimides. Conversely, an average roughness in excess of 300 nm produces the possibility of adversely affecting the flying behavior as a suspension.

A layer of polyimides useful for this invention means a layer of polymers containing imide linkages in their structure such as polyimides, polyamideimides, and polyetherimides. In this case, the layer of polyimides may have a multilayer structure consisting of plural kinds of polyimides. The thickness of the polyimide layer is 3 to 20 μm, preferably 5 to 15 μm, or more preferably 7 to 12 μm. When the thickness of the polyimide layer is less than 3 μm, the electrical insulation becomes less reliable and at the same time the electrical characteristics deteriorate. On the other hand, a thickness in excess of 20 μm makes it difficult to perform patterning of polyimides with high precision.

The linear expansion coefficient of polyimides to be used in this invention is $1\times10^{-5}/°$ C. to $3\times10^{-5}/°$ C., preferably $1.5\times10^{-5}/°$ C. to $2.5\times10^{-5}/°$ C. When the linear expansion coefficient of the polyimides is either less than $1\times10^{-5}/°$ C. or more than $3\times10^{-5}/°$ C., the laminate tends to deflect after removal by etching of the electrically conductive layer or the stainless steel base material.

Furthermore, laminates of this invention for use in HDD suspensions are required to develop an adhesive strength of 0.5 kg/cm or more between the stainless steel base material and the polyimide layer and also between the electrically conductive layer and the polyimide layer. For this reason, it is desirable for the polyimide layer to have some adhesiveness.

In general, however, there is a tendency that polyimides with a linear expansion coefficient in excess of $3\times10^{-5}/°$ C. show relatively good adhesion to metals while polyimides with a linear expansion coefficient of $1\times10^{-5}/°$ C. to $3\times10^{-5}/°$ C. do not show good adhesion to metals.

In consequence, the structure desirable for the layer of polyimides in this invention is multilayer consisting of at least two layers, namely, a layer of polyimides of low thermal expansion with a linear expansion coefficient of $2.5\times10^{-5}/°$ C. or less and a layer of polyimides of high thermal expansion with a linear expansion coefficient of $3\times10^{-5}/°$ C. or more, and the layer of polyimides of high thermal expansion is in direct contact with the electrically conductive layer.

Still more desirable is a three-layer structure consisting of a layer of polyimides of high thermal expansion 1, a layer of polyimides of low thermal expansion, and a layer of polyimides of high thermal expansion 2. Here, the linear expansion coefficient of two layers of polyimides of high thermal expansion 1 and 2 is $3\times10^{-5}/°$ C. or more and the layers 1 and 2 may be identical with or different from each other. The linear expansion coefficient of the layer of polyimides of low thermal expansion is $2.5\times10^{-5}/°$ C. or less. A multilayer structure formed by combination of a layer of polyimides of low thermal expansion and a layer of polyimides of high thermal expansion in this manner enables the formation of a resin layer satisfying both low thermal expansion and strong adhesion.

Patterning of the layer of polyimides is essential in fabricating laminates of this invention into HDD suspensions and the layer of polyimides is desirably etchable with ease. It is therefore desirable that a layer of polyimides to be used in this invention shows an etching rate of 0.5 μm or more when immersed in 100% hydrated hydrazine at 50° C. The layer of polyimides in this invention is desirably of multilayer structure consisting of a layer of polyimides of low thermal expansion and a layer of polyimides of high thermal expansion. In the cases where the layer of polyimides assumes such multilayer structure, it is desirable that each layer of polyimides shows an etching rate of 0.5 μm or more when immersed in 100% hydrated hydrazine at 50° C.

Polyimides useful for this invention are prepared from diamines and tetracarboxylic acid derivatives as raw materials in two steps by synthesis of polyamic acids which are precursors of polyimides and imidation. The tetracarboxylic acid derivatives include tetracarboxylic acids and their acid anhydrides, esters, and halides and acid anhydrides are preferable for ease of synthesis of polyamic acids. The imidation reaction is normally carried out by applying a solution of polyamic acids to the base material such as stainless steel, drying to remove the solvent, and heating at high temperature. When the solvent solubility after the imidation is good, it is possible to carry out the imidation in solution by heating the polyamic acid solution. The imidation reaction may be accelerated by addition of an amine such as pyridine or acetic anhydride. Moreover, such additives as fillers and silane coupling agents may be incorporated into polyimides as needed.

As mentioned above, the layer of polyimides of this invention preferably assumes a multilayer structure consisting of a layer of polyimides of low thermal expansion and a layer of polyimides of high thermal expansion, and polyimides containing 50% by weight or more of the structural unit represented by the following general formula (1)

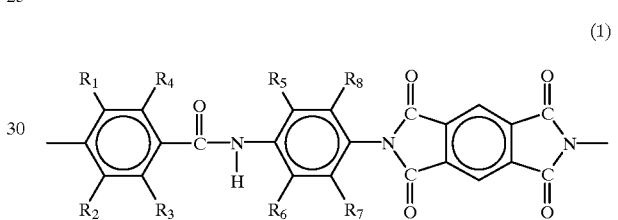

(1)

(wherein $R_1$ to $R_8$ are hydrogen, halogen, lower alkyl, or lower alkoxy, identical with or different from one another, and one of them is alkoxy) are desirable as polyimides of low thermal expansion.

Another example of polyimides of low thermal expansion is polyimides containing 50% by weight or more of the structural unit represented by the following general formula (2)

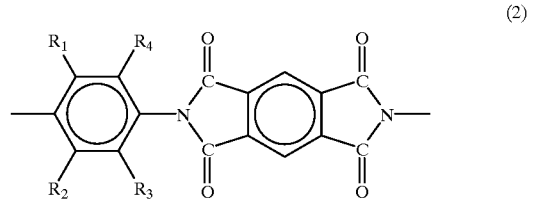

(2)

(wherein $R_1$ to $R_4$ are hydrogen, halogen, lower alkyl, or lower alkoxy and they may be identical with or different from one another).

A desirable example of polyimides of high thermal expansion are those in which 70% by weight or more of the tetracarboxylic acid-derived structural units is accounted for by at least one kind of tetracarboxylic acid unit selected from pyromellitic acid derivative unit, 3,4,3',4'-diphenylsulfonetetracarboxylic acid derivative unit, and 3,4, 3',4'-diphenylethertetracarboxylic acid dianhydride unit. A more desirable example is polyimides containing 70% by weight or more of the structural unit represented by the following general formula (3)

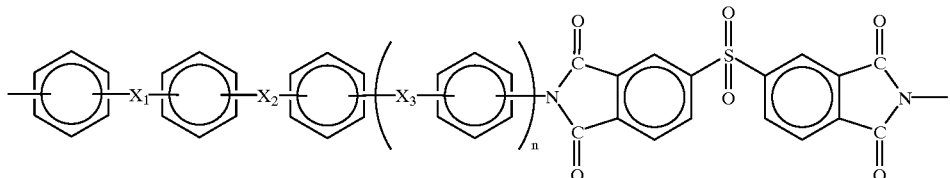

(3)

(wherein $X_1$ to $X_3$ are —O—, —C(CH$_3$)$_2$—, —SO$_2$—, —CH$_2$— or nil, identical with or different from one another, and n is 0 or 1).

Another desirable example of polyimides of high thermal expansion is polyimides containing 70% by weight or more of the structural unit represented by the following general formula (4)

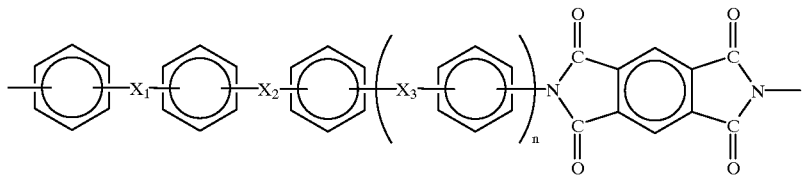

(4)

(wherein $X_1$ to $X_3$ are —O—, —C(CH$_3$)$_2$—, —SO$_2$—, —CH$_2$— or nil, identical with or different from one another, and n is 0 or 1).

An electrical conductor with a thickness of 3 to 20 μm is used as an electrically conductive layer in laminates of this invention. A thickness of less than 3 μm increases electrical resistance while a thickness in excess of 20 μm makes it difficult to perform high-precision patterning and, because of its rigidity, reduction of flying height of the slider becomes difficult to achieve. A desirable electrically conductive layer is a foil of copper or copper alloy with a thickness of 5 to 18 μm. The copper alloy here means a foil of alloy composed of copper and another element such as nickel, silicon, zinc and beryllium with a copper content of 80% or more. The use of a copper foil or a copper alloy foil as an electrically conductive layer enables fine patterning of the electrically conductive layer with ease and, in addition, leads to high electrical conductivity and improved mechanical strength of the electrical conductor.

A laminate of this invention can be prepared, for example, by the following methods.

Method 1: A solution of polyimides or polyimide precursors is applied to a stainless steel base material in one layer or more, dried, subjected to heat treatment at high temperature to form a layer of polyimides, and the layer of polyimides is contact-bonded under heat in an apparatus such as press and laminator to an electrical conductor such as a foil of copper or copper alloy.

Method 2: A solution of polyimides or polyimide precursors is applied to an electrical conductor such as a foil of copper or copper alloy in one layer or more, dried, subjected to heat treatment at high temperature to form a layer of polyimides, and the layer of polyimides is contact-bonded under heat in an apparatus such as press and laminator to a stainless steel base material.

Method 3: A layer of polyimides of high thermal expansion is formed on both sides of a polyimide film which has been made ready in advance and the three-layer film is contact-bonded under heat in an apparatus such as press and laminator to a stainless steel base material on one side and to an electrical conductor such as a foil of copper or copper alloy on the other.

Of these methods, ease of preparation and dimensional stability of the product laminates favor the aforementioned method 1, according to which a solution of polyimides or polyimide precursors is applied to a stainless steel base material in one layer or more, dried, subjected to heat treatment at high temperature to form a layer of polyimides, and the layer of polyimides is contact-bonded under heat in an apparatus such as press and laminator to an electrical conductor such as a foil of copper or copper alloy.

A more favorable method is the following: a stainless steel base material is coated successively with a solution of polyimides of high thermal expansion 1 or polyimide precursors of high thermal expansion 1, a solution of polyimide precursors of low thermal expansion, and a solution of polyimides of high thermal expansion 2 or polyimide precursors of high thermal expansion 2, dried, subjected to heat treatment at 250° C. or more to form a layer of polyimides with a thickness of 3 to 20 μm and a linear expansion coefficient of $1\times10^{-5}$/° C. to $3\times10^{-5}$/° C. and the layer of polyimides is contact-bonded under heat to an electrically conductive layer with a thickness of 3 to 20 μm.

The method for fabricating laminates of this invention into HDD suspensions is elective and the fabrication is normally carried out in the following steps.

Step 1: The electrically conductive layer is etched the first time by such a process as photoetching to effect specified patterning.

Step 2: The layer of polyimides is etched with the patterned electrically conductive layer as resist. As for the etching method, chemical etching by hydrazine or etching by laser or plasma is recommended.

Step 3: The electrically conductive layer is etched the second time by such a process as photoetching to form the finally-required wiring.

Step 4: The stainless steel base material is fabricated by etching into the specified shape.

In addition to the aforementioned steps, formation of a protective layer on the wiring, fabrication by bending of stainless steel, and annealing of stainless steel are generally performed.

Laminates of this invention for HDD suspensions can be used in the so-called 3-piece type suspensions consisting of a mount, a load beam and a flexure or in the so-called 2-piece type suspensions with integrated load beam and flexure. The laminates are generally used in the flexure portion in the case of the 3-piece type.

PREFERRED EMBODIMENTS OF THE INVENTION

This invention will be described concretely below with reference to the accompanying examples and comparative examples. The following procedures were used to determine the linear expansion coefficient, heat shrinkage, average roughness along center line, and adhesive strength in the examples and comparative examples.

(1) The linear expansion coefficient was determined with the aid of a thermomechanical analyzer (product of Seiko Denshi Kabushiki Kaisha). The linear expansion coefficient of polyimides was determined by heating the specimen to 250° C., holding the specimen at this temperature for 20 minutes, cooling at a rate of 10° C./min and calculating the average linear expansion coefficient from 240° C. to 100° C. The linear expansion coefficient of stainless steel was determined by heating the specimen to 340° C., holding the specimen at this temperature for 20 minutes, cooling at a rate of 10° C./min and calculating the average linear expansion coefficient from 330° C. to 100° C.

(2) The heat shrinkage of stainless steel was determined on a 300 mm square specimen. Holes with a diameter of 1 mm were drilled at an interval of approximately 250 mm in the transverse and longitudinal directions with the use of an NC drill (CPDR-2700, product of Ando Denki Kabushiki Kaisha), and the distance between the two holes drilled at an interval of approximately 250 mm was measured accurately in advance with the aid of a digital precision two-dimensional length meter (TDS-7055EX, product of Kabushiki Kaisha Topro Kikaku) and designated as L1. The specimen was then heated at 330° C. for 30 minutes in air and the distance of the two holes was measured again and designated as L2. The heat shrinkage was calculated as follows:

Heat shrinkage (%)=[(L1−L2)/L1]×100.

(3) The average roughness along center line (R a) was determined with the aid of a roughness meter (TENCOR P-10, product of Tencor Instruments) under the conditions of a cut-off value of 0.08 mm and a measuring length of 0.2 mm.

(4) The adhesive strength between stainless steel and polyimides was determined as follows. The sample was prepared by forming 1 mm-wide linear patterning on stainless steel while leaving the electrical conductor on the back as it was, the electrical conductor side was pasted to a fixed plate, the stainless steel was peeled in the 180° direction with the aid of a tensile tester (Strograph-MI, product of Toyo Seiki Kabushiki Kaisha) and the peel strength was determined. Likewise, the adhesive strength between electrical conductor and polyimides was determined in the same manner except on the sample prepared by forming 1 mm-wide linear patterning on the electrical conductor while leaving the stainless steel on the back as it was.

The properties of the stainless steel foils used in Examples 1 to 9 and Comparative Examples 1 to 3 are shown in Table 1 below.

TABLE 1

| | Ex 1-4 | Ex 5 | Ex 6 | Ex 7 | Ex 8 | Ex 9 | Comp Ex 1-2 | Comp Ex 3 |
|---|---|---|---|---|---|---|---|---|
| Thickness (μm) | 20 | 51 | 20 | 20 | 20 | 20 | 20 | 20 |
| Linear expansion coeff*[1] (× $10^{-5}$/° C.) | 1.86 / 1.78 | 1.92 / 1.82 | 1.77 / 1.82 | 2.05 / 1.83 | 1.98 / 1.77 | 1.86 / 1.83 | 1.86 / 1.78 | 1.79 / 1.83 |
| Heat shrinkage*[1] (%) | 0.005 / 0.018 | 0.007 / 0.012 | 0.003 / 0.008 | 0.005 / 0.017 | 0.004 / 0.006 | 0.006 / 0.028 | 0.005 / 0.018 | 0.005 / 0.015 |
| Average roughness along center line*[1] (nm) | 58 / 63 | 48 / 60 | 130 / 145 | 65 / 80 | 63 / 55 | 92 / 45 | 58 / 63 | 15 / 18 |

(Note)
*[1]The numerical value in the upper row refer to the transverse direction and those in the lower row to the longitudinal direction.

The symbols used in the examples stand for the following.
MABA: 4,4'-Diamino-2'-methoxybenzanilide
DAPE: 4,4'-Diaminodiphenyl ether
PDA: p-Phenylenediamine
APB: 1,3-Bis(4-aminophenoxy)benzene
BAPS: Bis(4-aminophenoxyphenyl) sulfone
BAPB: 4,4'-Bis(3-aminophenoxy)biphenyl
PMDA: Pyromellitic acid dianhydride
DSDA: 3,4,3',4'-diphenylsulfonetetracarboxylic acid dianhydride
DMAc: N,N-Dimethylacetamide

Synthetic Example 1

In a 5-l separable flask, 154.4 g (0.60 mole) of MABA and 80.1 g (0.40 mole) of DAPE were dissolved in 2,560 g of DMAc with stirring. The solution was cooled in an ice bath and 218.1 g (1 mole) of PMDA was added with passage of a stream of nitrogen. The solution was allowed to return to room temperature and stirred continuously for 3 hours to effect polymerization. There was obtained a viscous solution of polyimide precursor A.

The solution of polyimide precursor A was applied to a stainless steel foil (tension-annealed SUS 304, product of Nippon Steel Corporation) by an applicator, dried at 130° C. for 30 minutes, then subjected to heat treatment at 160° C. for 4 minutes, at 200° C. for 2 minutes, at 270° C. for 2 minutes, at 320° C. for 2 minutes and at 360° C. for 2 minutes to form a 25 μm-thick layer of polyimides on the stainless steel foil. When the polyimides were immersed in 100% hydrated hydrazine at 50° C. with the stainless steel foil still attached, the polyimides were etched at a rate of 2.5 μm/min. Finally, the stainless steel foil was removed by etching with an aqueous solution of ferric chloride to give a polyimide film with a linear expansion coefficient of 1.4× $10^{-5}$/° C.

Synthetic Example 2

In a 5-l separable flask, 75.7 g (0.7 mole) of PDA and 60.1 g (0.3 mole) of DAPE were dissolved in 2,010 g of DMAc with stirring. The solution was cooled in an ice bath and 218.1 g (1 mole) of PMDA was added with passage of a stream of nitrogen. The solution was allowed to return to room temperature and stirred continuously for 3 hours to effect polymerization. There was obtained a viscous solution of polyimide precursor B. The polyimides prepared from polyimide precursor B in the same manner as in Synthetic Example 1 showed an etching rate of 3.2 μm/min and a linear expansion coefficient of $1.7\times10^{-5}/°$ C.

Synthetic Example 3

In a 5-l separable flask, 292.3 g (1 mole) of APB was dissolved in 3,690 g of DMAc with stirring. The solution was cooled in an ice bath and 358.3 g (1 mole) of DSDA was added with passage of a stream of nitrogen. The solution was allowed to return to room temperature and stirred continuously for 3 hours to effect polymerization. There was obtained a viscous solution of polyimide precursor C. The polyimides prepared from polyimide precursor C in the same manner as in Synthetic Example 1 showed an etching rate of 2.3 μm/min and a linear expansion coefficient of $4.8\times10^{-5}/°$ C.

Synthetic Example 4

In a 5-l separable flask, 292.3 g (1 mole) of APB was dissolved in 3,530 g of DMAc with stirring. The solution was cooled in an ice bath and 286.6 g (0.8 mole) of DSDA and 43.6 g (0.2 mole) of PMDA were added with passage of a stream of nitrogen. The solution was allowed to return to room temperature and stirred continuously for 3 hours to effect polymerization. There was obtained a viscous solution of polyimide precursor D. The polyimides prepared from polyimide precursor D in the same manner as in Synthetic Example 1 showed an etching rate of 2.4 μm/min and a linear expansion coefficient of $4.7\times10^{-5}/°$ C.

Synthetic Example 5

In a 5-l separable flask, 432.5 g (1 mole) of BAPS was dissolved in 3,160 g of DMAc with stirring. The solution was cooled in an ice bath and 358.3 g (1 mole) of DSDA was added with passage of a stream of nitrogen. The solution was allowed to return to room temperature and stirred continuously for 3 hours to effect polymerization. There was obtained a viscous solution of polyimide precursor E. The polyimides prepared from polyimide precursor E in the same manner as in Synthetic Example 1 showed an etching rate of 2.2 μm/min and a linear expansion coefficient of $5.4\times10^{-5}/°$ C.

Synthetic Example 6

In a 5-l separable flask, 368.4 g (1 mole) of BAPB was dissolved in 3,320 g of DMAc with stirring. The solution was cooled in an ice bath and 218.1 g (1 mole) of PMDA was added with passage of a stream of nitrogen. The solution was allowed to return to room temperature and stirred continuously for 3 hours to effect polymerization. There was obtained a viscous solution of polyimide precursor F. The polyimides prepared from polyimide precursor F in the same manner as in Synthetic Example 1 showed an etching rate of 2.7 μm/min and a linear expansion coefficient of $4.3\times10^{-5}/°$ C.

EXAMPLE 1

The stainless steel foil (tension-annealed SUS 304, product of Nippon Steel Corporation) shown in Table 1 was coated with the solution of polyimide precursor C obtained in Synthetic Example 3 to an after-cure thickness of 1 μm with the aid of a bar coater, dried at 130° C. for 4 minutes, further coated with the solution of polyimide precursor A obtained in Synthetic Example 1 to an after-cure thickness of 7 μm, dried at 130° C. for 8 minutes, and still further coated with the solution of polyimide precursor D obtained in Synthetic Example 4 to an after-cure thickness of 2 μm, dried at 130° C. for 4 minutes, and then subjected to heat treatment in a stream of nitrogen at 160° C. for 4 minutes, at 200° C. for 2 minutes, at 270° C. for 2 minutes, at 320° C. for 2 minutes and at 360° C. for 2 minutes to complete the curing. There was obtained a laminate of the stainless steel foil and layers of polyimides with the combined thickness of 10 μm.

An electrolytic copper foil (CF-T9 with a thickness of 9 μm, product of Fukuda Metal Foil and Powder Co., Ltd.) was placed on the polyimide side of the laminate and contact-bonded in a vacuum press at 150 kg/cm² and 330° C. for 20 minutes to give the object laminate.

Practically no deflection was observed in the laminate thus obtained and the adhesive strength between stainless steel and polyimide and that between copper and polyimide were 1.1 kg/cm and 0.9 kg/cm respectively. The linear expansion coefficient of the polyimide film obtained by removing the stainless steel and copper foils by etching was $2.2\times10^{-5}/°$ C. and practically no deflection occurred when either stainless steel or copper was etched. When the laminate was tested for heat resistance by placing in an oven at 300° C. for 1 hour, no abnormalities such as blistering and peeling were observed.

EXAMPLE 2

A laminate was prepared as in Example 1 except using the solution of polyimide precursor E obtained in Synthetic Example 5 in place of the solution of polyimide precursor D. Practically no deflection was observed in the laminate and the adhesive strength between stainless steel and polyimide and that between copper and polyimide were 1.2 kg/cm and 0.8 kg/cm respectively. The linear expansion coefficient of the polyimide film obtained by removing the stainless steel foil and copper foils by etching was $2.4\times10^{-5}/°$ C. and practically no deflection occurred when either stainless steel or copper was etched. The laminate showed no abnormalities when tested for heat resistance.

EXAMPLE 3

A laminate was prepared as in Example 1 except using the solution of polyimide precursor D in place of the solution of polyimide precursor C and controlling the after-cure thickness of polyimide precursor D at 2 μm and that of polyimide precursor A at 8 μm to obtain a combined thickness of 12 μm for the layers of polyimides. Practically no deflection was observed in the laminate and the adhesive strength between stainless steel and polyimide and that between copper and polyimide were 0.8 kg/cm and 0.7 kg/cm respectively. The linear expansion coefficient of the polyimide film obtained by removing the stainless steel and copper foils by etching was $2\times10^{-5}/°$ C. and practically no deflection occurred when either stainless steel or copper was etched. The laminate showed no abnormalities when tested for heat resistance.

EXAMPLE 4

A laminate was prepared as in Example 1 except using an 18 μm-thick copper alloy foil (C7025 TM-03, product of Olin Somers) in place of the 9 μm-thick electrolytic copper foil. Practically no deflection was observed in the laminate and the adhesive strength between stainless steel and polyimide and that between copper and polyimide were 1.2 kg/cm and 2.1 kg/cm respectively. The linear expansion coefficient of the polyimide film obtained by removing the stainless steel and copper foils by etching was $2.2 \times 10^{-5}/°$ C. and practically no deflection occurred when either stainless steel or copper was etched. The laminate showed no abnormalities when tested for heat resistance.

EXAMPLE 5

A laminate was prepared as in Example 1 except using the stainless steel foil shown in Table 1. Practically no deflection was observed in the laminate and the adhesive strength between stainless steel and polyimide and that between copper and polyimide were 1.6 kg/cm and 0.9 kg/cm respectively. The linear expansion coefficient of the polyimide film obtained by removing the stainless steel and copper foils by etching was $2.2 \times 10^{-5}/°$ C. and practically no deflection occurred when either stainless steel or copper was etched. The laminate showed no abnormalities when tested for heat resistance.

EXAMPLE 6

A laminate was prepared as in Example 1 except using the solution of polyimide precursor F obtained in Synthetic Example 6 in place of the solution of polyimide precursor C and that of polyimide precursor D, using the solution of polyimide precursor B obtained in Synthetic Example 2 in place of polyimide precursor A, and further using an 18 μm-thick copper alloy foil (C7025 TM-3, product of Olin Somers) in place of the 9 μm-thick electrolytic copper foil. Practically no deflection was observed in the laminate and the adhesive strength between stainless steel and polyimide and that between copper and polyimide were 0.8 kg/cm and 1.8 kg/cm respectively. The linear expansion coefficient of the polyimide film obtained by removing the stainless steel and copper foils by etching was $2.5 \times 10^{-5}/°$ C. and practically no deflection occurred when either stainless steel or copper was etched. The laminate showed no abnormalities when tested for heat resistance.

EXAMPLE 7

A laminate was prepared as in Example 1 except using the stainless steel foil shown in Table 1. Practically no deflection was observed in the laminate and the adhesive strength between stainless steel and polyimide and that between copper and polyimide were 1.3 kg/cm and 0.8 kg/cm respectively. The linear expansion coefficient of the polyimide film was $2.2 \times 10^{-5}/°$ C. and practically no deflection occurred when either stainless steel or copper was etched. In this example, however, the stainless steel foil in use showed a large linear expansion coefficient of $2.05 \times 10^{-5}/°$ C. in the transverse direction and the laminate obtained was observed to generate gentle curling with the stainless steel foil forming the inner side.

EXAMPLE 8

A laminate was prepared as in Example 1 except using the stainless steel foil shown in Table 1. Practically no deflection was observed in the laminate and the adhesive strength between stainless steel and polyimide and that between copper and polyimide were 1.1 kg/cm and 0.8 kg/cm respectively. The linear expansion coefficient of the polyimide film was $2.2 \times 10^{-5}/°$ C., practically no deflection occurred when either stainless steel or copper was etched, and the laminate showed no abnormalities when tested for heat resistance. In this example, however, the stainless steel foil in use showed a fairly large difference in linear expansion coefficient of $0.21 \times 10^{-5}/°$ C. between the transverse and longitudinal directions and the laminate obtained was observed to generate gentle wave with the stainless steel foil forming the inner side.

EXAMPLE 9

A laminate was prepared as in Example 1 except using the stainless steel foil shown in Table 1. Practically no deflection was observed in the laminate and the adhesive strength between stainless steel and polyimide and that between copper and polyimide were 1.2 kg/cm and 0.9 kg/cm respectively. The linear expansion coefficient of the polyimide film was $2.2 \times 10^{-5}/°$ C., practically no deflection occurred when either stainless steel or copper was etched, and the laminate showed no abnormalities when tested for heat resistance. In this example, however, the stainless steel foil in use showed large heat shrinkage of 0.028% in the longitudinal direction and the laminate obtained was observed to generate gentle curling with the stainless steel foil forming the inner side.

Comparative Example 1

The solution of polyimide precursor C obtained in Synthetic Example 3 was applied to a stainless steel foil (tension-annealed SUS 304, product of Nippon Steel Corporation) to an after-cure thickness of 10 μm by an applicator, dried at 130° C. for 4 minutes, then subjected to heat treatment in a stream of nitrogen successively at 160° C. for 4 minutes, at 200° C. for 2 minutes, at 270° C. for 2 minutes, at 320° C. for 2 minutes and at 360° C. for 2 minutes to complete the curing. There was obtained a laminate composed of the stainless steel foil and a layer formed thereon of polyimides. The polyimide side of the laminate was placed on a copper foil (electrolytic copper foil CF-T9 with a thickness of 9 μm, product of Fukuda Metal Foil and Powder Co., Ltd.) and contact-bonded in a vacuum press at 150 kg/cm² and 330° C. for 20 minutes to give a laminate. This laminate showed an adhesive strength of 1.0 kg/cm between stainless steel and polyimide and 0.8 kg/cm between copper and polyimide and no abnormalities when tested for heat resistance at 300° C. for 1 hour. However, the polyimide film obtained by removing the stainless steel and copper foils by etching showed a high linear expansion coefficient of $4.8 \times 10^{-5}/°$ C. and the laminate of copper and polyimides remaining after removal of the stainless steel foil by etching was observed to curl greatly with a curvature diameter of 1 cm or so.

Comparative Example 2

The solution of polyimide precursor A obtained in Synthetic Example 1 was applied to a stainless steel foil (tension-annealed SUS 304, product of Nippon Steel Corporation) to an after-cure thickness of 8 μm by an applicator, dried at 130° C. for 8 minutes, the solution of polyimide precursor D obtained in Synthetic Example 4 was further applied similarly to an after-cure thickness of 2 μm, dried at 130° C. for 4 minutes, then subjected to heat treatment in a stream of nitrogen successively at 160° C. for 4 minutes, at 200° C. for 2 minutes, at 270° C. for 2 minutes, at 320° C. for 2 minutes and at 360° C. for 2 minutes to complete the curing. There was obtained a laminate composed of the stainless steel foil and layers formed thereon of polyimides with a combined thickness of 10 μm. The polyimide side of the laminate was placed on a copper foil (electrolytic copper foil CF-T9 with a thickness of 9 μm, product of Fukuda Metal Foil and Powder Co., Ltd.) and contact-bonded in a vacuum press at 150 kg/cm² and 330° C. for 20 minutes to give a laminate. This laminate showed practically no deflection but a low adhesive strength of 0.2 kg/cm between stainless steel and polyimide. When the laminate was tested for heat resistance in an oven at 300° C. for 1 hour, the occurrence of peeling was confirmed between stainless steel and polyimide.

Comparative Example 3

A laminate was prepared as in Example 1 except using the stainless steel foil shown in Table 1. The laminate thus obtained was practically free of deflection, but it showed a low adhesive strength of 0.3 kg/cm between stainless steel and polyimide because the average roughness along center line (R a) of the stainless steel foil showed a small value of 18 nm to 15 nm. Also, the occurrence of blistering was confirmed when the laminate was tested for heat resistance at 300° C. for 1 hour.

Industrial Applicability

Laminates of this invention for use in HDD suspensions excel in such properties as adhesive strength, heat resistance, flatness, and dimensional stability, allow fine patterning on the electrically conductive layer and the polyimide layer, and enable the preparation of HDD suspensions with extremely high precision. Moreover, the process of this invention for preparing laminates for use in HDD suspensions can make laminates of small deflection and excellent heat resistance and adhesive strength stably in high yield with the concomitant reduction in manufacturing cost.

What is claimed is:

1. Laminates for use in HDD suspensions comprising steel base material and successive layers formed thereon of polyimides and an electrical conductor wherein said stainless steel base material and said layer of polyimides satisfy the following conditions (a) to (d);
   (a) the layer of polyimides shows a linear expansion coefficient in the range from $1 \times 10^{-5}/°$ C. to $3 \times 10^{-5}/°$ C.,
   (b) the layer of polyimides shows an etching rate of 0.5 μm/min or more when immersed in 100%-hydrated hydrazine at 50° C.,
   (c) the stainless steel base material shows heat shrinkage of 0.025% or less in each of the transverse and longitudinal directions when subjected to heat treatment at 330° C. for 30 minutes in air, and
   (d) the stainless steel base material shows an average roughness along center line (Ra) of 20 to 300 nm on the surface to be laminated to the layer of polyimides, and, still more, the adhesive strength between the layers of stainless steel base material and polyimides and that between the layers of polyimides and electrical conductor are 0.5 kg/cm or more, respectively.

2. Laminates for use in HDD suspensions as described in claim 1 wherein said layer of polyimides has a multilayer structure, at least a two-layer structure, containing a layer of polyimides of low thermal expansion with a linear expansion coefficient of $2.5 \times 10^{-5}/°$ C. or less and a layer of polyimides of high thermal expansion with a linear expansion coefficient of $3 \times 10^{-5}/°$ C. or more and the layer of polyimides of high thermal expansion is in contact with the layer of the electrical conductor.

3. Laminates for use in HDD suspensions as described in claim 2, wherein said polyimides of low thermal expansion are polyimides containing 50% by weight or more of the structural unit represented by the following general formula (1)

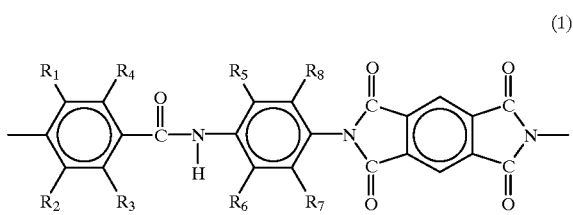

in which $R_1$ to $R_8$ are hydrogen, halogen, or methoxy group, identical with or different from one another, and one of them is a methoxy group.

4. Laminates for use in HDD suspensions as described in claim 2, wherein said polyamides are polyimides containing 50% by weight or more of the structural unit represented by the following general formula (2)

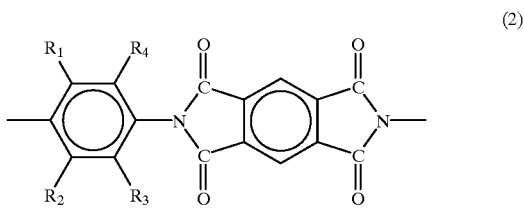

in which $R_1$ to $R_4$ are hydrogen, halogen, or methoxy group, identical with or different from one another.

5. Laminates for use in HDD suspensions as described in claim 2 wherein said polyimides of high thermal expansion are polyimides in which at least one kind of tetracarboxylic acid unit selected from pyromellitic acid derivative unit, 3,4,3',4'-diphenylsulfonetetracarboxylic acid derivative unit, and 3,4,3',4'-diphenylethertetracarboxylic acid dianhydride derivative unit accounts for 70% by weight or more of the tetracarboxylic acid-based structural unit.

6. Laminates for use in HDD suspensions as described in claim 2 wherein said polyimides of high thermal expansion are polyimides containing 70% by weight or more of the structural unit represented by the following general formula (3)

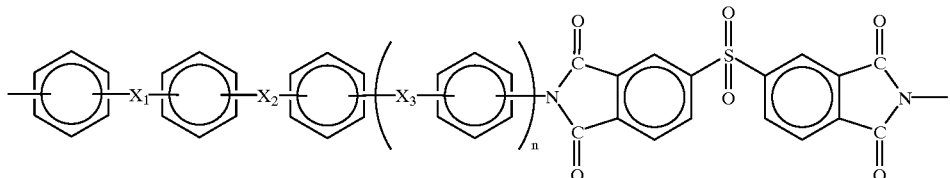

(3)

in which $X_1$ to $X_3$ are —O—, —C(CH$_3$)$_2$—, —SO$_2$—, —CH$_2$— or nil, identical with or different from one another, wherein n is 0 or 1.

7. Laminates for use in HDD suspensions as described in claim 2 wherein said polyimides of high thermal expansion are polyimides containing 70% by weight or more of the structural unit represented by the following general formula (4)

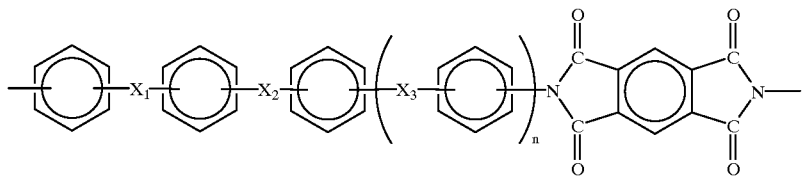

(4)

in which $X_1$ to $X_3$ are —O—, —C(CH$_3$)$_2$—, —SO$_2$—, —CH$_2$— or nil, identical with or different from one another, and n is 0 or 1.

8. Laminates for use in HDD suspensions as described in claim 1 wherein said layer of polyimides has a three-layer structure containing a layer of polyimides of high thermal expansion 1, a layer of polyimides of low thermal expansion, and a layer of polyimides of high thermal expansion 2, the linear expansion coefficient of the layer of polyimides of high thermal expansion 1 and that of the layer of polyimides of high thermal expansion 2 are $3\times10^{-5}/°$ C. or more, either identical with or different from each other, and the linear expansion coefficient of the aforementioned layer of polyimides of low thermal expansion is $2.5\times10^{-5}/°$ C. or less.

9. Laminates for use in HDD suspensions as described in claim 8, wherein said layer of polyimides shows a rate of etching of 0.5 μm/min or more when immersed in 100% hydrated hydrazine at 50° C. and the rate of etching of the low thermal expansion polyimide is greater than that of the high thermal expansion polyimide.

10. Laminates for use in HDD suspensions as described in claim 1, wherein the electrical conductor is a copper or copper alloy foil.

11. Laminates for use in HDD suspensions comprising steel base material and successive layers formed thereon of polyimides and an electrical conductor wherein said stainless steel base material and said layer of polyimides satisfy the following conditions (a) to (d);

(a) the layer of polyimides shows a linear expansion coefficient in the range from $1\times10^{-5}/°$ C. to $3\times10^{-5}/°$ C., (b) the layer of polyimides shows an etching rate of 0.5 μm/min or more when immersed in 100%-hydrated hydrazine at 50° C., (c) the stainless steel base material shows heat shrinkage of 0.025% or less in each of the transverse and longitudinal directions when subjected to heat treatment at 330° C. for 30 minutes in air, and (d) the stainless steel base material shows an average roughness along center line (Ra) of 20 to 300 nm on the surface to be laminated to the layer of polyimides, wherein the linear expansion coefficient of said stainless steel base material is in the range of $1.75\times10^{-5}/°$ C. to $2.0\times10^{-5}/°$ C. in each of the transverse and longitudinal directions and the difference in linear expansion coefficient between the transverse and longitudinal directions is $0.15\times10^{-5}/°$ C. or less and, the adhesive strength between the layers of stainless steel base material and polyimides and that between the layers of polyimides and electrical conductor are 0.5 kg/cm or more, respectively.

12. A process for preparing laminates for use in HDD suspensions comprising applying a solution of polyimide precursors or polyimides in one layer or more to a stainless steel base material with a thickness of 10 to 70 μm, drying, performing heat treatment at 250° C. or more to form a layer of polyimides with a thickness of 3 to 20 μm and a linear expansion coefficient of $1\times10^{-5}/°$ C. to $3\times10^{-5}/°$ C., and contact-bonding said layer of polyimides under heat to a layer of electrical conductor with a thickness of 3 to 20 μm.

13. The process for producing laminates for use in HDD suspensions as described in claim 12, wherein the electrical conductor is a copper or copper alloy foil.

14. A process for preparing laminates for use in HDD suspensions comprising applying successively a solution of polyimides of high thermal expansion 1 or polyimide precursors of high thermal expansion 1, a solution of polyimide precursors of low thermal expansion, and a solution of polyimides of high thermal expansion 2 or polyimide precursors of high thermal expansion 2 to a stainless steel base material with a thickness of 10 to 70 μm, drying, and performing heat treatment at 250° C. or more to form a layer of polyimides with a thickness of 3 to 20 μm and a linear expansion coefficient of $1\times10^{-5}/°$ C., to $3\times10^{-5}/°$ C., and contact-bonding said layer of polyimides under heat to a layer of electrical conductor with a thickness of 3 to 20 μm.

* * * * *